United States Patent
Park et al.

(10) Patent No.: US 12,400,990 B2
(45) Date of Patent: Aug. 26, 2025

(54) SEMICONDUCTOR PACKAGE

(71) Applicant: SAMSUNG ELECTRONICS CO., LTD., Suwon-si (KR)

(72) Inventors: Sechul Park, Bucheon-si (KR); Unbyoung Kang, Hwaseong-si (KR); Heewon Kim, Asan-si (KR); Jongho Park, Cheonan-si (KR); Hyojin Yun, Suwon-si (KR); Juil Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 594 days.

(21) Appl. No.: 17/723,552

(22) Filed: Apr. 19, 2022

(65) Prior Publication Data
US 2023/0060115 A1   Feb. 23, 2023

(30) Foreign Application Priority Data
Aug. 17, 2021  (KR) .................. 10-2021-0108325

(51) Int. Cl.
*H01L 23/00* (2006.01)
*H01L 25/065* (2023.01)
*H01L 23/498* (2006.01)

(52) U.S. Cl.
CPC ............ *H01L 24/32* (2013.01); *H01L 24/16* (2013.01); *H01L 24/33* (2013.01); *H01L 24/73* (2013.01);
(Continued)

(58) Field of Classification Search
CPC ......... H01L 24/32; H01L 24/16; H01L 24/33; H01L 24/73; H01L 25/0652; H01L 25/0657; H01L 23/49816; H01L 23/49822; H01L 23/49833; H01L 24/83; H01L 2224/16148; H01L 2224/16227; H01L 2224/16237; H01L 2224/16238; H01L 2224/26145; H01L 2224/3201;
(Continued)

(56) References Cited

U.S. PATENT DOCUMENTS

| 8,441,123 B1 * | 5/2013 | Lee ................ H01L 21/563 |
| | | 257/737 |
| 9,030,030 B2 | 5/2015 | Lee et al. |

(Continued)

*Primary Examiner* — Fernando L Toledo
*Assistant Examiner* — Shawn Shaw Muslim
(74) *Attorney, Agent, or Firm* — Muir Patent Law, PLLC

(57) ABSTRACT

A semiconductor package includes a first semiconductor chip on a base chip, a second semiconductor chip on the first semiconductor chip in a first direction, each of the first and second semiconductor chips including a TSV and being electrically connected to each other via the TSV, dam structures on the base chip and surrounding a periphery of the first semiconductor chip, a first adhesive film between the base chip and the first semiconductor chip, a portion of the first adhesive film filling a space between the first semiconductor chip and the dam structures, a second adhesive film between the first semiconductor chip and the second semiconductor chip, a portion of the second adhesive film overlapping the dam structures in the first direction, and an encapsulant encapsulating a portion of each of the dam structures, the first semiconductor chip, and the second semiconductor chip.

20 Claims, 17 Drawing Sheets

(52) U.S. Cl.
CPC ...... *H01L 25/0652* (2013.01); *H01L 25/0657* (2013.01); *H01L 23/49816* (2013.01); *H01L 23/49822* (2013.01); *H01L 23/49833* (2013.01); *H01L 24/83* (2013.01); *H01L 2224/16148* (2013.01); *H01L 2224/16227* (2013.01); *H01L 2224/16237* (2013.01); *H01L 2224/16238* (2013.01); *H01L 2224/26145* (2013.01); *H01L 2224/3201* (2013.01); *H01L 2224/32059* (2013.01); *H01L 2224/32145* (2013.01); *H01L 2224/3303* (2013.01); *H01L 2224/33055* (2013.01); *H01L 2224/73204* (2013.01); *H01L 2224/83203* (2013.01); *H01L 2225/06513* (2013.01); *H01L 2225/06517* (2013.01); *H01L 2225/06524* (2013.01); *H01L 2225/06527* (2013.01); *H01L 2225/06541* (2013.01); *H01L 2924/1431* (2013.01); *H01L 2924/1436* (2013.01)

(58) Field of Classification Search
CPC . H01L 2224/32059; H01L 2224/32145; H01L 2224/3303; H01L 2224/33055; H01L 2224/73204; H01L 2224/83203; H01L 2225/06513; H01L 2225/06517; H01L 2225/06524; H01L 2225/06527; H01L 2225/06541; H01L 2924/1431; H01L 2924/1436; H01L 25/50; H01L 21/563; H01L 23/49827; H01L 24/13; H01L 24/29; H01L 24/75; H01L 25/18; H01L 2224/16145; H01L 24/92; H01L 2224/16225; H01L 2224/27013; H01L 2224/32225; H01L 2224/81801; H01L 2224/83007; H01L 2224/8385; H01L 2224/92125; H01L 2225/06565; H01L 2225/06582; H01L 2225/06589; H01L 2924/07802; H01L 2924/15192; H01L 2924/15311; H01L 2924/181; H01L 2924/18161; H01L 23/16; H01L 24/97; H01L 23/3128; H01L 23/3142; H01L 23/3157; H01L 24/18; H01L 2224/24146
See application file for complete search history.

(56) References Cited

U.S. PATENT DOCUMENTS

| | | |
|---|---|---|
| 9,397,078 B1* | 7/2016 | Chandolu ........... H01L 25/0657 |
| 9,691,746 B2 | 6/2017 | Vadhavkar et al. |
| 10,529,637 B1* | 1/2020 | Yu ........................ H01L 24/32 |
| 2008/0237895 A1 | 10/2008 | Saeki |
| 2016/0233113 A1 | 8/2016 | Hu et al. |
| 2018/0331076 A1* | 11/2018 | Park ..................... H01L 23/3128 |
| 2019/0221520 A1 | 7/2019 | Kim et al. |
| 2021/0098318 A1 | 4/2021 | Wang et al. |
| 2021/0111160 A1 | 4/2021 | Kim |

* cited by examiner

SEMICONDUCTOR PACKAGE

CROSS-REFERENCE TO RELATED APPLICATION

This application claims benefit of priority to Korean Patent Application No. 10-2021-0108325, filed on Aug. 17, 2021, in the Korean Intellectual Property Office, the disclosure of which is incorporated herein by reference in its entirety.

BACKGROUND

1. Field

The present disclosure relates to a semiconductor package.

2. Description of the Related Art

With weight reductions and performance improvements in electronic devices, miniaturization and high performance are also required in a field of semiconductor packages. To implement miniaturization, weight reduction, high performance, high capacity, and high reliability in a semiconductor package, research and development (R&D) of a semiconductor package having a structure, in which semiconductor chips are stacked in multiple stages, is continuously being conducted.

SUMMARY

According to an example embodiment, a semiconductor package includes a base chip; a first semiconductor chip and second semiconductor chips sequentially stacked on the base chip in a first direction, including a through-silicon via (TSV), and electrically connected to each other by the through-silicon via; dam structures disposed on the base chip and surrounding a periphery of the first semiconductor chip; a first adhesive film disposed between the base chip and the first semiconductor chip; second adhesive films disposed between the first semiconductor chip and the second semiconductor chips; and an encapsulant encapsulating at least a portion of each of the dam structures, the first semiconductor chip, and the second semiconductor chips. At least a portion of the first adhesive film fills spaces between the first semiconductor chip and the dam structures, and at least portions of the second adhesive films overlap the dam structures in the first direction.

According to an example embodiment, a semiconductor package includes a base chip; a semiconductor chip disposed on the base chip; dam structures disposed on the base chip and surrounding a side surface of the semiconductor chip; and an adhesive film disposed between the base chip and the semiconductor chip and protruding further the side surface of the semiconductor chip to be in contact with an inner surface of the dam structures. An upper surface of the dam structures is disposed on a level lower than a level of an upper surface of the semiconductor chip.

According to an example embodiment, a semiconductor package includes a base chip; a first semiconductor chip and second semiconductor chips sequentially stacked on the base chip; dam structures disposed on the base chip to respectively correspond to side surfaces of the first semiconductor chip; a first adhesive film disposed between the base chip and the first semiconductor chip; and second adhesive films disposed between the first semiconductor chip and a lowermost second semiconductor chip among the second semiconductor chips, and between the second semiconductor chips. The first adhesive film or a lowermost second adhesive film among the second adhesive films is in contact with an upper surface of the dam structures.

BRIEF DESCRIPTION OF DRAWINGS

Features will become apparent to those of skill in the art by describing in detail exemplary embodiments with reference to the attached drawings, in which.

DETAILED DESCRIPTION

Figure 1A:
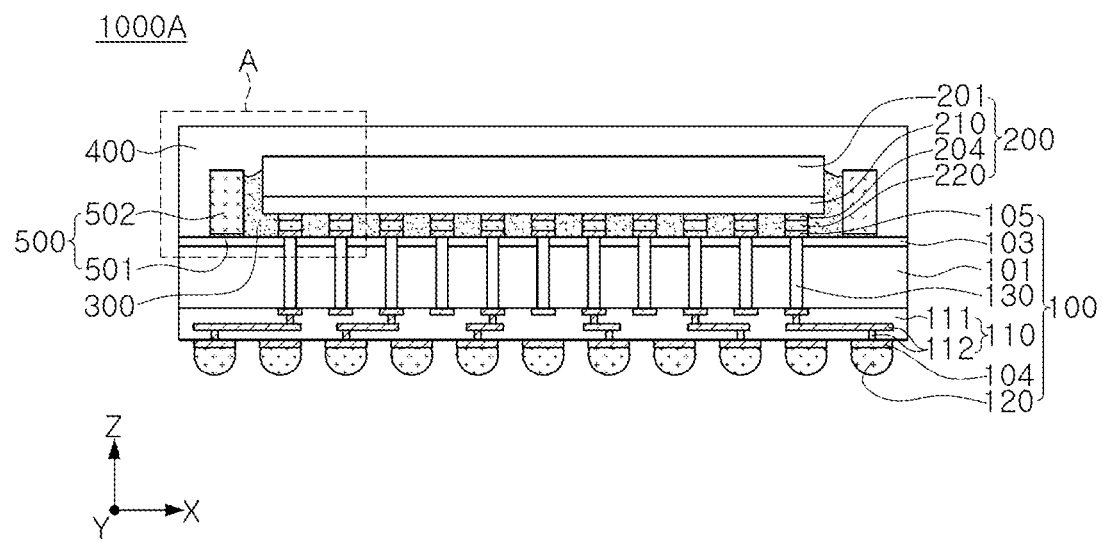
FIG. 1A is a cross-sectional view of a semiconductor package according to an example embodiment.
Figure 1B:
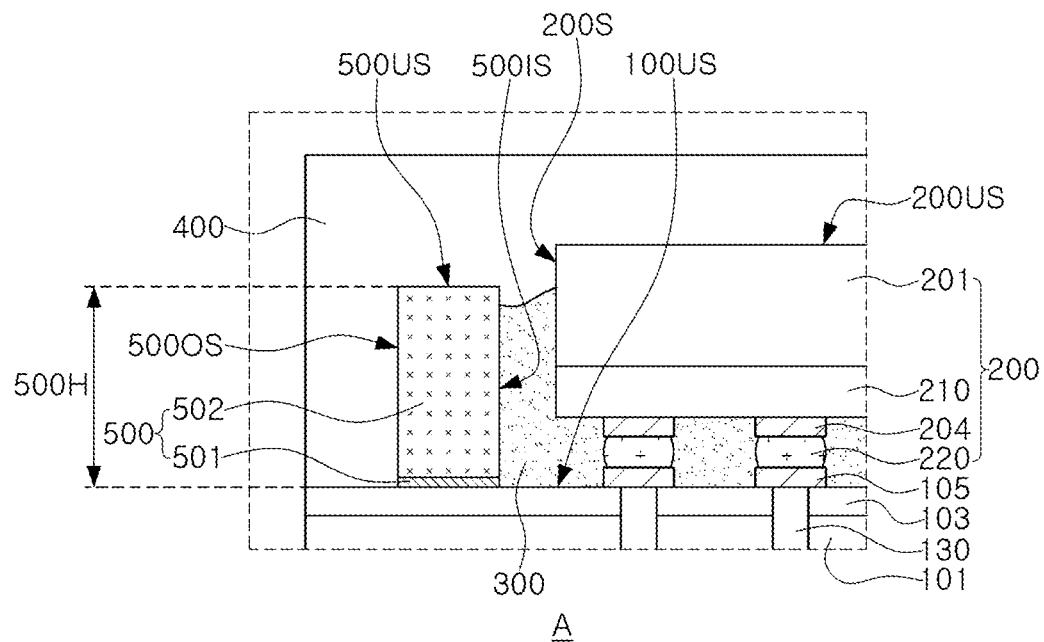
FIG. 1B is a partially enlarged view of region "A" of FIG. 1A.
Figure 1C:
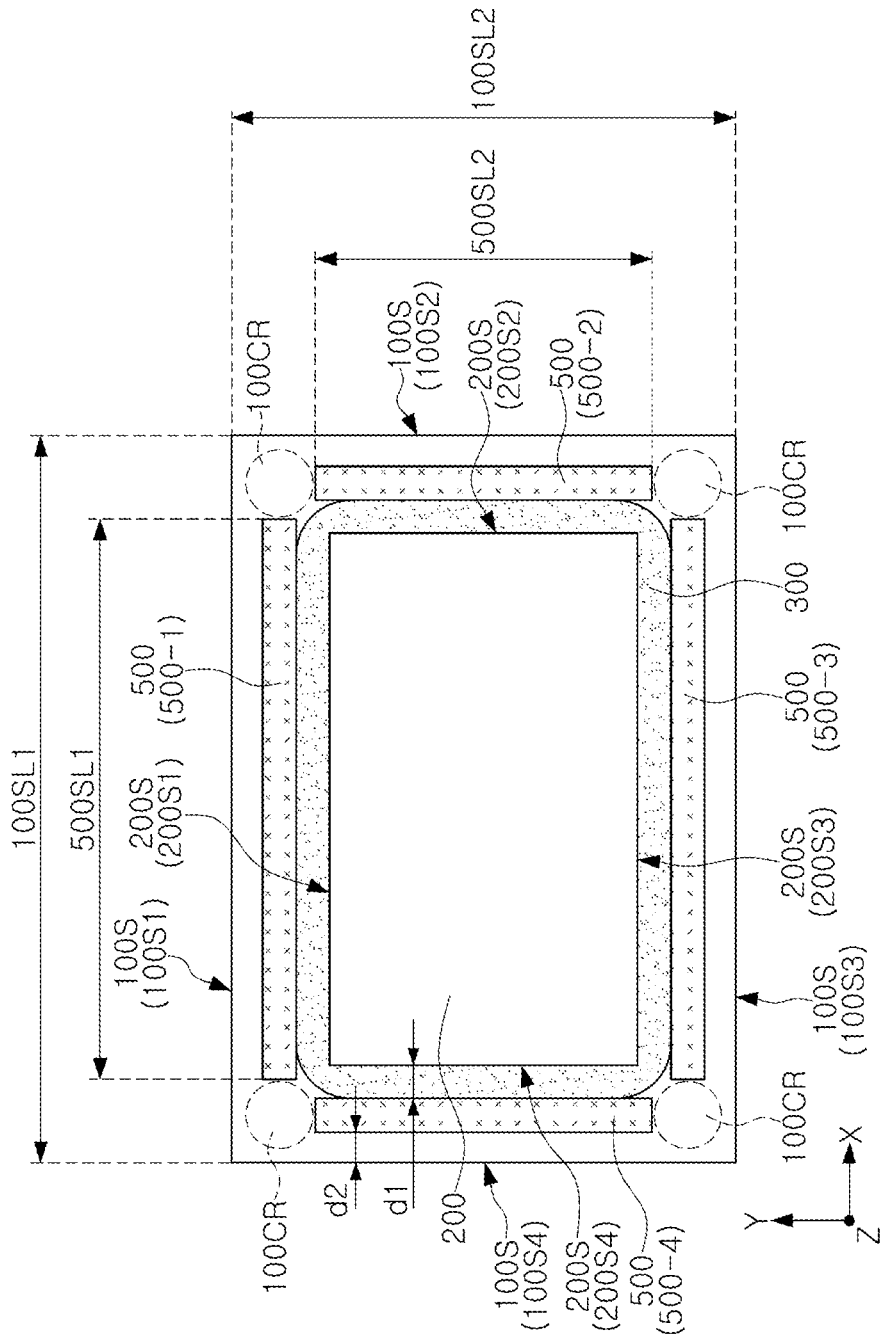
FIG. 1C is a plan view of the semiconductor package of FIG. 1A.

FIG. 1A is a cross-sectional view of a semiconductor package 1000A according to an example embodiment, FIG. 1B is a partially enlarged view of region "A" of FIG. 1A, and FIG. 1C is a plan view of the semiconductor package 1000A of FIG. 1A.

Referring to FIGS. 1A to 1C, a semiconductor package 1000A according to an example embodiment may include a base chip 100, a semiconductor chip 200, an adhesive film 300, and a dam structure 500. The semiconductor package 1000A may further include an encapsulant 400 encapsulating the semiconductor chip 200.

In a thermocompression bonding process of fixing the semiconductor chip 200 to the base chip 100, an extending region of an adhesive film formed to protrude farther than a side surface of the semiconductor chip 200 may cause a poor exterior and a decrease in reliability of a semiconductor package. In contrast, in the present disclosure, an extending region of the adhesive film 300 between the base chip 100 and the semiconductor chip 200 may be controlled using the dam structure 500 to be prevented from protruding outwardly of the base chip 100, and thus, reliability of the semiconductor package 1000A may be improved.

For example, the base chip 100 may include a semiconductor material, e.g., a silicon (Si) wafer. In another example, the base chip 100 may be a printed circuit board (PCB) or a glass substrate which does not include a semiconductor material. In an example embodiment, the base chip 100 may include a substrate 101, an upper passivation layer 103, an upper pad 105 and a lower pad 104, a device layer 110, an external connection terminal 120, and a through-silicon via (TSV) 130. However, when the base chip 100 is a PCB or a glass substrate which does not include a semiconductor material, the base chip 100 may not include a device layer and a TSV.

For example, the base chip 100 may be a buffer chip including a plurality of logic devices and/or memory devices in the device layer 110. Accordingly, the base chip 100 may transmit a signal from the semiconductor chip 200 stacked thereon to an external entity, and may also transmit a signal and power from an external entity to the semiconductor chip 200. For example, the base chip 100 may perform both logic functions and memory functions through logic devices and memory devices. In another example, the base chip 100 may include only logic devices to perform only logic functions.

For example, the substrate 101 may include a semiconductor element, e.g., silicon or germanium (Ge), or a compound semiconductor, e.g., silicon carbide (SiC), gallium arsenide (GaAs), indium arsenide (InAs), or indium phosphide (InP). In another example, the substrate 101 may have a silicon-on-insulator (SOI) structure. The substrate 101 may include a conductive region, e.g., a well doped with impurities or a structure doped with impurities. The substrate 101 may include various device isolation structures, e.g., a shallow trench isolation (STI) structure.

The upper passivation layer 103 may be formed on an upper surface of the substrate 101 and may protect the substrate 101. For example, the upper passivation layer 103 may be formed of silicon, silicon nitride, or silicon oxynitride film. In another example, the upper passivation layer 103 may be formed of a polymer, e.g., polyimide (PI). A lower passivation layer may be further formed on a lower surface of the device layer 110.

The upper pad 105 may be disposed on the upper passivation layer 103. The upper pad 105 may include at least one of, e.g., aluminum (Al), copper (Cu), nickel (Ni), tungsten (W), platinum (Pt), and gold (Au). The lower pad 104 may be disposed below the device layer 110, and may include a material similar to that of the upper pad 105.

The device layer 110 may be disposed on a lower surface of the substrate 101 and may include various types of devices. For example, the device layer 110 may include a field-effect transistor (FET), e.g., a planar FET or a FinFET, a memory device, e.g., a flash memory, a dynamic random access memory (DRAM), a static random access memory (SRAM), an electrically erasable programmable read-out (EEPROM), a phase-change random access memory (PRAM), a magnetoresistive random access memory (MRAM), a ferroelectric random access memory (FeRAM), a resistive random access memory (RRAM), or the like, a logic device, e.g., an AND, OR, NOT, and the like, and various active and/or passive devices, e.g., a system large scale integration (LSI), a CMOS Imaging Sensor (CIS), and a micro-electro-mechanical system (MEMS).

The device layer 110 may include an interlayer insulating layer 111 and a multilayer interconnection layer 112 on the above-described devices. The interlayer insulating layer 111 may include, e.g., silicon oxide or silicon nitride. The multilayer interconnection layer 112 may include a multilayer interconnection and/or a vertical contact. The multilayer interconnection layer 112 may connect devices of the device layer 110 to each other, devices to a conductive region of the substrate 101, or devices to an external connection terminal 120.

The external connection terminal 120 may be disposed on the lower pad 104, and may be connected to the interconnection layer 112 or the TSV 130 inside the device layer 110. For example, the external connection terminal 120 may be formed of a solder ball. In another example, the external connection terminal 120 may have a structure including a pillar and a solder. The semiconductor package 1000A may be mounted on an external substrate, e.g., an interposer or a package substrate, through the external connection terminal 120.

The through-silicon via (TSV) 130 may penetrate through the substrate 101 in a vertical direction (a Z-axis direction), and may provide an electrical path for connecting the upper pad 105 and the lower pads 104 to each other. The TSV 130 may include a conductive plug and a barrier layer surrounding the conductive plug. The conductive plug may include a metal material, e.g., tungsten (W), titanium (Ti), aluminum (Al), or copper (Cu). The conductive plug may be formed by, e.g., a plating process, a physical vapor deposition (PVD) process, or a chemical vapor deposition (CVD) process. The barrier layer may include an insulating barrier layer or a conductive barrier layer. The insulating barrier layer may be formed of, e.g., oxide, nitride carbide, a polymer, or combinations thereof. The conductive barrier layer may be disposed between the insulating barrier layer and the conductive plug. For example, the conductive barrier layer may include a metal compound, e.g., tungsten nitride (WN), titanium nitride (TiN), or tantalum nitride (TaN). The barrier layer may be formed in, e.g., a PVD process or a CVD process.

The semiconductor chip 200 may be stacked on the base chip 100, and may include a substrate 201, a device layer 210, and a bump 220. In the drawing, only one semiconductor chip 200 is illustrated, but the number of semiconductor chips is not limited thereto. For example, two or more semiconductor chips may be stacked on the base chip 100. The substrate 201 may have characteristics similar to those described for the substrate 101 of the base chip 100.

The device layer 210 may include a plurality of memory devices. For example, the device layer 210 may include volatile memory devices, e.g., DRAM and SRAM, or nonvolatile memory devices, e.g., PRAM, MRAM, FeRAM, and RRAM. For example, in the semiconductor package 1000A, the semiconductor chip 200 may include DRAM devices in the device layer 210. Accordingly, the semiconductor package 1000A may be used for a high bandwidth memory (HBM) product, an electro data processing (EDP) product, or the like.

The device layer 210 may include a multilayer interconnection layer therebelow. The multilayer interconnection layer may have characteristics similar to those described for the multilayer interconnection layer 112 of the device layer 110 in the base chip 100. Therefore, devices of the device layer 210 may be electrically connected to the bump 220 through the multilayer interconnection layer. In an example, the base chip 100 may include a plurality of logic devices or memory devices in the device layer 110, and may be referred to as a buffer chip, a control chip, or the like, according to a function thereof, whereas the semiconductor chip 200 may include a plurality of memory devices in the device layer 210, and may be referred to as a core chip.

The bump 220 may be disposed on a connection pad 204 on a lower surface of the device layer 210, and may be connected to devices of the device layer 210 through an interconnection of the multilayer interconnection layer. The bump 220 may electrically connect the semiconductor chip 200 and the base chip 100 to each other. For example, the bump 220 may include a solder or both a pillar and a solder. The pillar may have a cylindrical column shape, or a polygonal column shape, e.g., a square column shape or an octagonal column shape, and may include, e.g., nickel (Ni), copper (Cu), palladium (Pd), platinum (Pt), gold (Au), or combinations thereof. A solder may have a spherical or ball shape, and may include, e.g., tin (Sn), indium (In), bismuth (Bi), antimony (Sb), copper (Cu), silver (Ag), zinc (Zn), lead (Pb), or alloys thereof. The alloys may include, e.g., Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, and the like.

The adhesive film 300 may be disposed between the base chip 100 and the semiconductor chip 200 to surround a side surface of the bump 220, and may fix the semiconductor chip 200 to the base chip 100. For example, as illustrated in FIG. 1A, the adhesive film 300 may be disposed between a top surface of the base chip 100 and a bottom surface of the semiconductor chip 200 to completely fill an empty spaced therebetween (e.g., while completely surrounding a perimeter of each of the bumps 220). As illustrated in FIGS. 1A to 1C, the adhesive film 300 may protrude outwardly from, e.g., beyond, a side surface 200S of the semiconductor chip 200 and may cover at least a portion of the side surface 200S of the semiconductor chip 200, e.g., the adhesive film 300 may protrude outwardly beyond the side surface 200S of the semiconductor chip 200 around an entire perimeter of the semiconductor chip 200 (FIG. 1C).

The adhesive film 300 may be a non-conductive film (NCF), and may include, e.g., any type of polymer film which may perform a thermocompression bonding process. The thermocompression bonding process may allow at least a portion of the adhesive film 300 to form an extension region flowing outwardly of the semiconductor chip 200 and protruding farther than the side surface 200S of the semiconductor chip 200. In the present disclosure, the flow region or the expansion region of the adhesive film 300 may be limited using a dam structure 500 to be described later. Accordingly, the adhesive film 300 may protrude farther than the side surface 200S of the semiconductor chip 200 to be in, e.g., direct, contact with internal surfaces 500IS of the dam structures 500. For example, the adhesive film 300 may not be in contact with the upper surfaces 500US of the dam structures 500, but example embodiments are not limited thereto, e.g., the adhesive film 300 may be in contact with upper surfaces 500US of at least some of the dam structures 500. It is noted that the upper surfaces 500US of the dam structures 500 refer to surfaces in the X-Y plane that face away from the base chip 100.

Figure 4A:
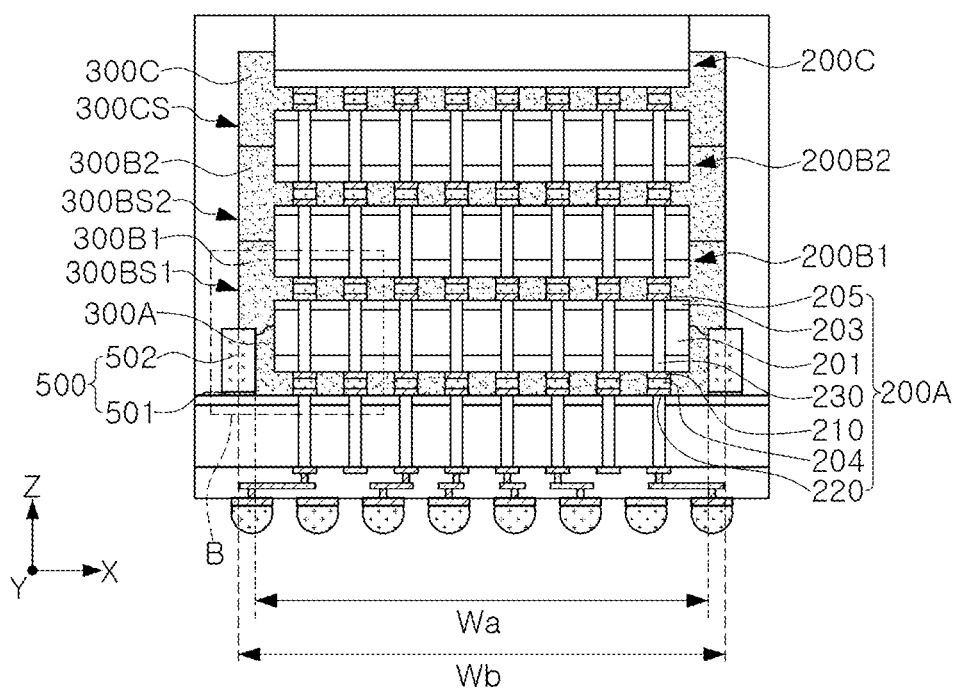
FIG. 4A is a cross-sectional view of a semiconductor package according to an example embodiment.

The encapsulant 400 may be disposed on the base chip 100, and may encapsulate at least a portion of the base chip 100, the semiconductor chip 200, the adhesive film 300, and the dam structure 500. For example, as illustrated in FIG. 1A, the encapsulant 400 may have a predetermined thickness and may cover an upper surface of the semiconductor chip 200. In another example, as illustrated in FIG. 4A, the encapsulant 400 may not cover the upper surface of the semiconductor chip 200, so the upper surface of the semiconductor chip 200 may be exposed from the encapsulant 400. The encapsulant 400 may include, e.g., an epoxy mold compound (EMC).

The dam structure 500 may be disposed on the base chip 100, and may include a seed layer 501 disposed on an upper surface 100US of the base chip 100 and a metal layer 502 disposed on the seed layer 501. For example, the seed layer 501 may have a single-layer structure or a multilayer structure including a metallic material or a material exhibiting metallic characteristics, e.g., a material including at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or an alloy including at least one metal or two or more metals thereof. The metal layer 502 may be a plating layer formed by an electrolytic plating process using the seed layer 501. For example, Referring to FIG. 1B, the dam structures 500 may include the inner surfaces 500IS facing the semiconductor chip 200, outer surfaces 500OS opposing the inner surfaces 500IS, and the upper surfaces 500US connecting the inner surfaces 500IS and the outer surfaces 500OS to each other. The dam structures 500 may also have lateral surfaces perpendicular to the upper surfaces 500US and the inner surfaces 500IS, e.g., the lateral surfaces may face corner portions 100CR of the base chip 100 (FIG. 1C). At least a portion of the inner surfaces 500IS may be in contact with the adhesive film 300, and at least a portion of the upper surfaces 500US and the outer surfaces 500OS, e.g., and the lateral surfaces, may be in contact with the encapsulant 400.

The dam structure 500 may be formed to have a predetermined height to avoid contact with a bonding head (see '20' of FIG. 7E) in a thermal compression process of the semiconductor chip 200 and to effectively limit the extension region of the adhesive film 300. As an example, the upper surfaces 500US of the dam structures 500 may be disposed on a level lower than a level of the upper surface 200US of the semiconductor chip 200, e.g., relative to the base chip 100. For example, the dam structures 500 may have a height 500H lower than a height from the upper surface 100US of the base chip 100 to the upper surface 200US of the semiconductor chip 200. The height 500H of the dam structures 500 may be less than about 100% of the height from the upper surface 100US of the base chip 100 to the upper surface 200US of the semiconductor chip 200. For example, the height 500H of the dam structures 500 may be about 90% or less to about 50% or more, about 90% or less to about 60% or more, or about 90% or less to about 70% or more of the height from the upper surface 100US of the base chip 100 to the upper surface 200US of the semiconductor chip 200. When the height 500H of the dam structures 500 is less than about 50% of the height from the upper surface 100US of the base chip 100 to the upper surface 200US of the semiconductor chip 200, the adhesive film 300 may overflow. When the height 500H of the dam structures 500 is greater than about 90% of the height from the upper surface 100US of the base chip 100 to the upper surface 200US of the semiconductor chip 200, the bonding head (see '20' of FIG. 7E) may be brought into contact with the dam structures 500 during the thermocompression bonding process, and thus, sufficient pressure may not be applied to the semiconductor chip 200.

The dam structures 500 may be formed to surround the side surface 200S of the semiconductor chip 200. For example, as illustrated in FIG. 1C, the dam structures 500 may include dam structures 500-1, 500-2, 500-3, and 500-4, respectively corresponding to side surfaces 200S1, 200S2, 200S3, and 200S4 of the semiconductor chip 200, on a plane (an X-Y plane). The dam structures 500 may have a shape extending continuously (see FIG. 1C) or discontinuously (to be described with reference to FIG. 3) between the side surfaces 200S of the semiconductor chip 200 and the side surfaces 100S of the base chip 100, e.g., as viewed in a plan view. The dam structures 500 may be spaced apart from each other in the corner portion 100CR of the base chip 100 to secure fluidity of the encapsulant 400, and a space between the dam structures 500 spaced apart from each other may be filled with the encapsulant 400. As an example, the dam structures 500 may extend to have a length of about 90% or less of lengths of the side surfaces 100S of the corresponding base chip 100, respectively. For example, the first dam structure 500-1 may extend to have a first length 500SL1 of about 90% or less of the length 100SL1 of the first side surface 100S1 of the corresponding base chip 100. In addition, the second dam structure 500-2 may extend to have a second length 500SL2 of about 90% or less of the length 100SL2 of the second side surface 100S2 of the corresponding base chip 100. When the length of the dam structures 500 exceeds about 90% of the length of the side surfaces 100S of the base chip 100, the fluidity of the encapsulant 400 may be reduced, so that spaces between the dam structures 500O and the semiconductor chip 200 may not be filled with the encapsulant 400. For example, in FIG. 1C, the adhesive film 300 is illustrated as being in continuous contact with inner surfaces of the dam structures 500 between the side surface 200S of the semiconductor chip 200 and the dam structures 500. In another example, contact surfaces between the adhesive film 300 and the dam structures 500 may be discontinuously formed.

The dam structures 500 may be spaced apart from the side surfaces 200S of the semiconductor chip 200 by a first distance d1 to secure an extension region or a flow region of the adhesive film 300. The first distance d1 may be selected in consideration of temperature and pressure conditions of the thermocompression bonding process, fluidity of the adhesive film 300, and the like. The dam structures 500 may have a predetermined separation distance from the side surfaces 100S of the base chip 100 to be prevented from overlapping a scribe lane (see 'SL' of FIG. 7I) of the base chip 100. For example, as illustrated in FIG. 1C, the dam structures 500-1, 500-2, 500-3, and 500-4 may be spaced part from the side surfaces 100S1, 100S2, 100S3, and 100S4 of the corresponding base chip 100 by a second distance d2, respectively. The second distance d2 may be about 5 μm or more, or about 10 μm or more. When the second distance d2 is less than about 5 μm, the dam structures 500 are exposed outwardly of the encapsulant 400 in a cutting process of the base chip 100, resulting in poor exterior and deteriorated reliability. For example, the second distance d2 may be adjusted in inverse proportion to the first distance d1, but may be secured as the above-described separation distance from the side surfaces 100S of the base chip 100 to prevent exposure of the dam structure 500.

Figure 2:
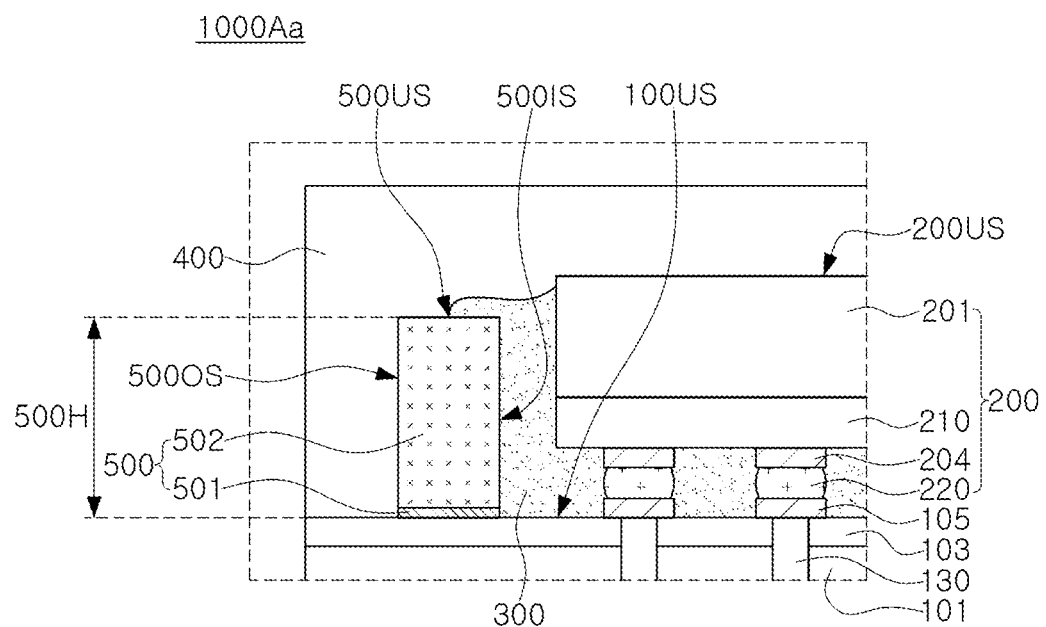
FIG. 2 is a partially enlarged view illustrating a modified example of the semiconductor package of FIG. 1A.

FIG. 2 is a partially enlarged view illustrating a modified example of the semiconductor package of FIG. 1A. FIG. 2 illustrates a region corresponding to FIG. 1B of a semiconductor package 1000Aa according to the modified example.

Referring to FIG. 2, in the modified example, the upper surfaces 500US of the dam structures 500 may be, e.g., at least partially, covered with the adhesive film 300. For example, the dam structures 500 may have the inner surfaces 500IS facing the semiconductor chip 200, the outer surfaces 500OS opposing the inner surfaces 200IS, and the upper surfaces 500US connecting the inner surfaces 500IS and the outer surfaces 500OS to each other. At least some of the inner surfaces 500IS and the upper surfaces 500US may be in contact with the adhesive film 300, and some of the remaining upper surfaces 500US and the outer surfaces 500OS may be in contact with the encapsulant 400. Even in this case, the contact surfaces between the upper surfaces 500US of the dam structures 500 and the adhesive film 300 may not be formed to have a constant width or may not be formed to be constant in a length direction of the dam structures 500. For example, according to example embodiments, the adhesive film 300 may have the shape illustrated in FIG. 1B in some regions and a shape illustrated in FIG. 2 in other regions.

Figure 3:
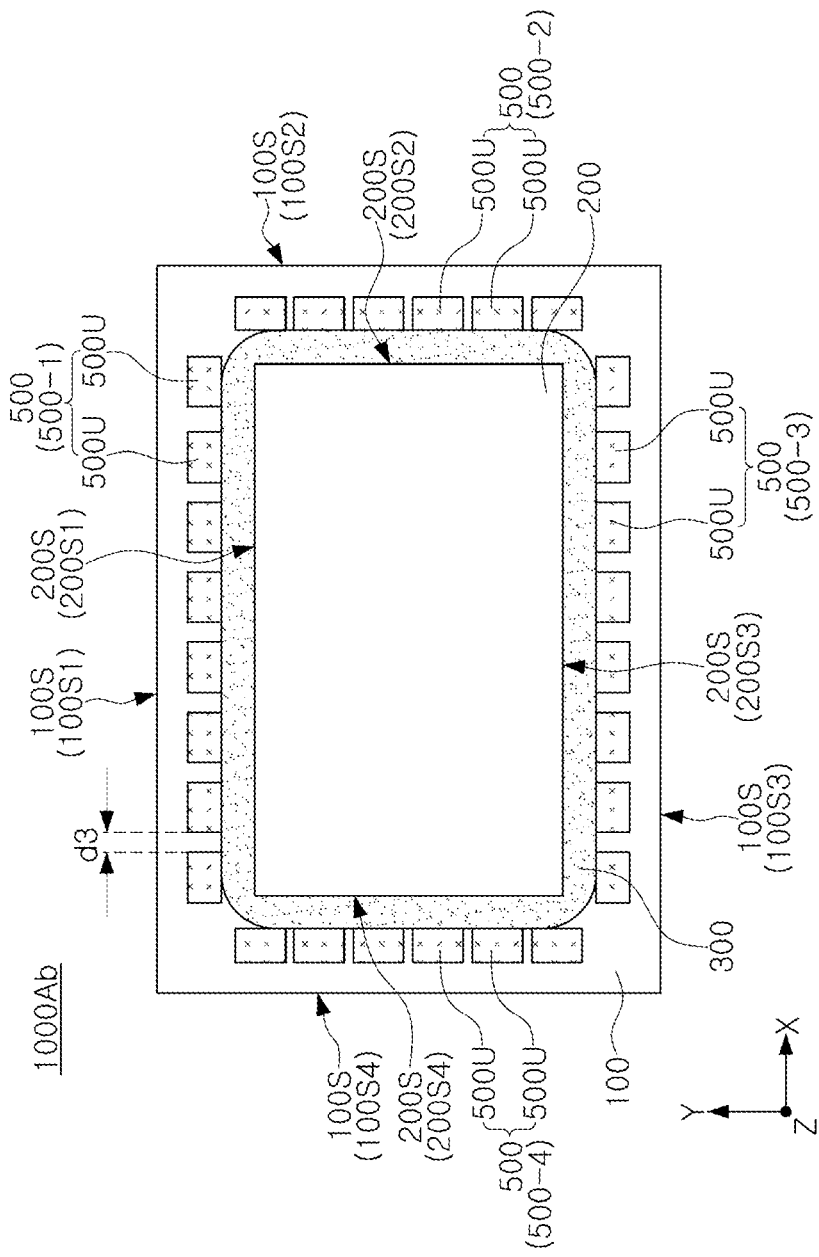
FIG. 3 is a plan view illustrating a modified example of the semiconductor package of FIG. 1A.

FIG. 3 is a plan view illustrating a modified example of the semiconductor package of FIG. 1A. FIG. 3 illustrates a region corresponding to FIG. 1C of a semiconductor package 1000Ab according to the modified example.

Referring to FIG. 3, in the modified example, the dam structures 500 may each include a plurality of dam units 500U arranged in parallel to side surfaces 200S of a semiconductor chip 200. In FIGS. 1C and 3, the adhesive film 300 is illustrated as being in continuous contact with the inner surface of the dam structures 500 between the side surfaces 200S of the semiconductor chip 200 and the dam structures 500. According to example embodiments, contact surfaces between the adhesive film 300 and the dam structures 500 may be discontinuously formed.

In another example, unlike that illustrated in FIGS. 1C and 3, the adhesive film 300 may be brought into contact with the dam structures 500 in an extension region having a maximum width in a direction perpendicular to the side surfaces 200S of the semiconductor chip 200, and may be spaced apart from the dam structures 500 in the extension region having a width smaller than or equal to the maximum width. For example, the extension region of the adhesive film 300 may not have a uniform width. According to the present embodiment, since the dam structures 500 include a plurality of dam units 500U spaced apart from each other, a non-contact region between the adhesive film 300 and the side surfaces 200S of the semiconductor chip 200 may be filled with the encapsulant 400. In addition, a flow region of the adhesive film 300 between the plurality of dam units 500U may be additionally secured to prevent overflow. A distance d3 between, e.g., adjacent ones of, the plurality of dam units 500U may be within a range of about 5 μm or less, e.g., about 5 μm to about 1 μm, about 4 μm to about 1 μm, and about 3 μm to about 1 μm. When the distance d3 between the plurality of dam units 500U exceeds about 5 μm, the adhesive film 300 may pass between adjacent ones of the plurality of dam units 500U to protrude farther outwardly than the dam structures 500. When the distance d3 between the plurality of dam units 500U is less than about 1 μm, filling properties of the encapsulant 400 may be deteriorated.

Figure 4B:
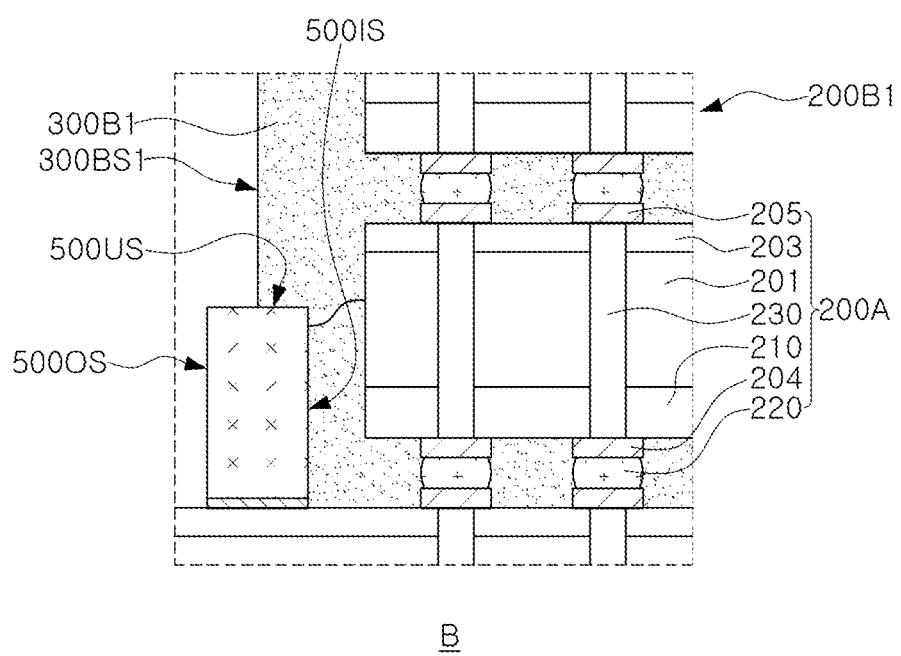
FIG. 4B is a partially enlarged view of region "B" of FIG. 4A.

FIG. 4A is a cross-sectional view of a semiconductor package according to an example embodiment, and FIG. 4B is a partially enlarged view of region "B" of FIG. 4A.

Referring to FIGS. 4A and 4B, a semiconductor package 1000B according to an example embodiment may have the same or similar features to those of the semiconductor package 1000A illustrated in FIG. 1A, except that a plurality of semiconductor chips 200A, 200B1, 200B2, and 200C may be stacked on the base chip 100 in a first direction (the Z-axis direction). Therefore, descriptions overlapping with those described with reference to FIGS. 1A and 1B will be omitted.

For example, as illustrated in FIGS. 4A-4B, the semiconductor package 1000B according to the present embodiment may further include a first semiconductor chip 200A mounted on the base chip 100, second semiconductor chips 200B1, 200B2, and 200C sequentially stacked on the first semiconductor chip 200A, and second adhesive films 300B1, 300B2, and 300C, respectively disposed below the second semiconductor chips 200B1, 200B2, and 200C. The first to second semiconductor chips 200A, 200B1, 200B2, and 200C stacked on the base chip 100 may include a through-silicon via (TSV) 230, and may be electrically connected to each other by the TSV 230. In an example, the number of semiconductor chips 200 stacked on the base chip 100 may be two, three, or five or more. Among the second semiconductor chips 200B1, 200B2 and 200C, the uppermost second semiconductor chip 200C does not include a TSV, and an upper surface thereof may be exposed from the encapsulant 400. According to example embodiments, an upper surface of the uppermost second semiconductor chip 200C may be covered with the encapsulant 400.

According to the present embodiment, damage to the base chip 100 may be prevented in a process of cutting extension regions of the second adhesive films 300B1, 300B2, and 300C using the dam structures 500. As a result, reliability of the semiconductor package 1000B may be improved. For example, the second adhesive films 300B1, 300B2, and 300C disposed between the first semiconductor chip 200A and the lowermost second semiconductor chip 200B1 and between the second semiconductor chips 200B1, 200B2, and 200C may be formed such that the side surfaces 300BS1, 300BS2, and 300CS thereof are disposed between the inner surface 500IS and the outer surface 500OS of the dam structures 500, e.g., along the X-axis direction (FIG. 4A) or on the upper surface 500US. In addition, as described with reference to FIG. 1A, or the like, the dam structures 500 may be disposed on the base chip 100 to surround the periphery of the first semiconductor chip 200A, and the expansion region or a flow region of the first adhesive film 300A disposed between the base chip 100 and the first semiconductor chip 200A may be limited, so that poor exterior and a decrease in reliability caused by the first adhesive film 300A may be prevented. Accordingly, at least a portion of the first adhesive film 300A may fill a space between the first semiconductor chip 200A and the dam structures 500 and may be in contact with the inner surface 500IS of the dam structures 500, and at least a portion of the adhesive films 300B1, 300B2, and 300C may overlap the dam structures 500 in the first direction (the Z-axis direction). In addition, at least a portion of the second adhesive films 300B1, 300B2, and 300C may be in contact with the upper surface 500US of the dam structures 500. For example, the lowermost second adhesive film 300B1 may be in, e.g., direct, contact with the upper surfaces 500US of the dam structures 500. In addition, the second adhesive films 300B1, 300B2, and 300C may be formed to have substantially the same width, e.g., along the X-axis direction, by a cutting process, and side surfaces 300BS1, 300BS2, and 300CS thereof may be substantially coplanar with each other. For example, a maximum width Wa of the first adhesive film 300A in a second direction (the X-axis direction) may be less than or equal to a maximum width Wb of the second adhesive films 300B1, 300B2, and 300C in the second direction (the X-axis direction).

Figure 5A:
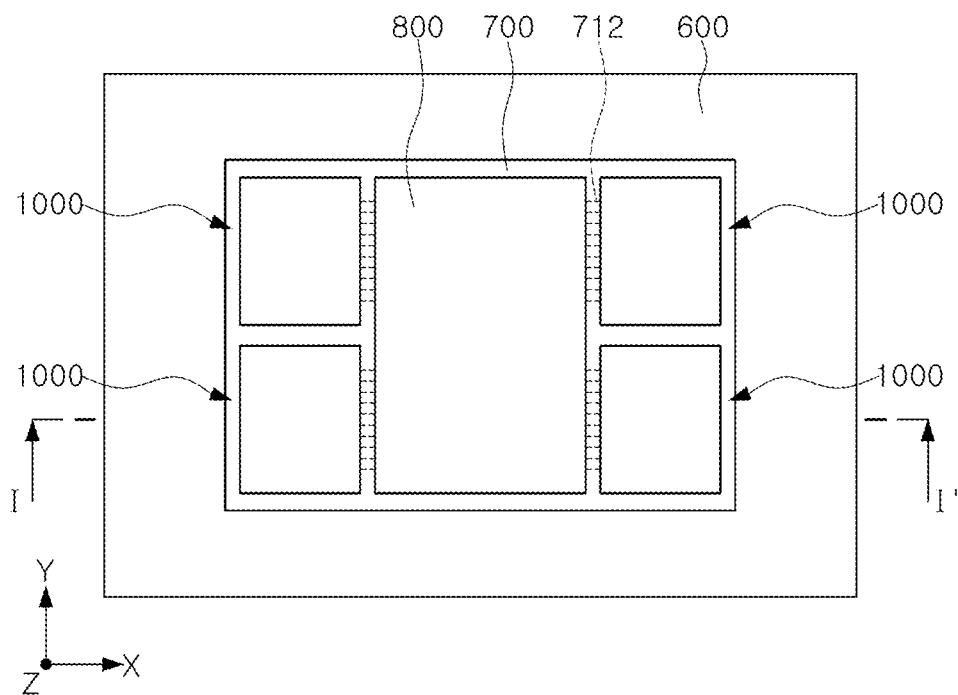
FIG. 5A is a plan view of a semiconductor package according to an example embodiment.
Figure 5B:
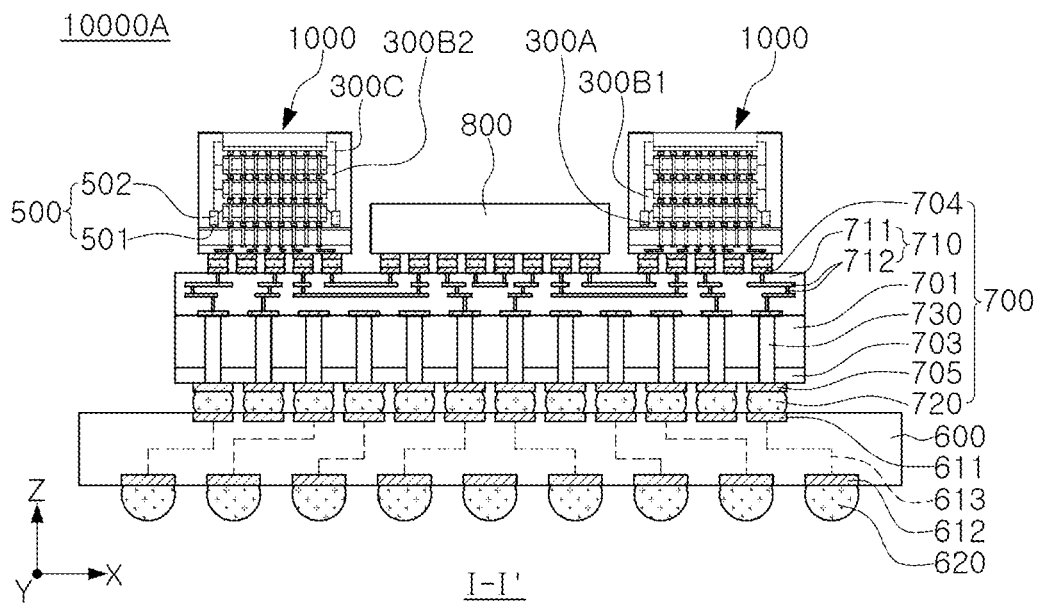
FIG. 5B is a cross-sectional view taken along line I-I' of FIG. 5A.

FIG. 5A is a plan view of a semiconductor package according to an example embodiment, and FIG. 5B is a cross-sectional view taken along line I-I' of FIG. 5A.

Referring to FIGS. 5A and 5B, a semiconductor package 10000A according to an example embodiment may include a package substrate 600, an interposer substrate 700, and at least one chip structure 1000. The semiconductor package 10000A may further include a logic chip or a processor chip 800 disposed to be adjacent to the chip structure 1000 on the interposer substrate 700.

The package substrate 600 may include a lower pad 612 disposed on a lower surface of a body, an upper pad 611 disposed on an upper surface of the body, and a redistribution circuit 613 electrically connecting the lower pad 612 and the upper pad 611 to each other. The package substrate 600 may be a support substrate on which the interposer substrate 700, the processor chip 800, and the chip structure 1000 are mounted, and may be a substrate for a semiconductor package including a printed circuit board (PCB), a ceramic substrate, a glass substrate, a tape interconnection board, or the like. The body of the package substrate 600 may include different materials depending on the type of substrates. For example, when the package substrate 600 is a PCB, it may have a form in which an interconnection layer is additionally laminated on one side or both sides of a body copper clad laminate or a copper clad laminate. A solder resist layer may be formed on each of the lower and upper surfaces of the package substrate 600. The lower and upper pads 612 and 611 and the redistribution circuit 613 may form an electrical path connecting the lower surface and the upper surface of the package substrate 600 to each other.

For example, the lower and upper pads 612 and 611 and the redistribution circuit 513 may be formed of a metallic material or a material exhibiting metallic characteristics, e.g., a material including at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or an alloy including at least one metal or two or more metals thereof. The redistribution circuit 613 may include multiple redistribution layers and vias connecting the multiple redistribution layers to each other. An external connection terminal 620, connected to the lower pad 512, may be disposed on the lower surface of the package substrate 600. The external connection terminal 620 may include, e.g., tin (Sn), indium (In), bismuth (Bi), antimony (Sb), copper (Cu), silver (Ag), zinc (Zn), lead (Pb), and/or alloys thereof.

The interposer substrate 700 may include a substrate 701, a lower passivation layer 703, a lower pads 705, an interconnection layer 710, bumps 720, and a through-electrodes 730. The chip structure 1000 and the processor chip 800 may be stacked on the package substrate 600 via the interposer substrate 700. The interposer substrate 700 may electrically connect the chip structure 1000 and the processor chip 800 to each other.

The substrate 701 may be formed of, e.g., silicon, an organic material, plastic, or a glass substrate. When the substrate 701 is a silicon substrate, the interposer substrate 700 may be referred to as a silicon interposer. In addition, when the substrate 701 is an organic substrate, the interposer substrate 700 may be referred to as a panel interposer.

The lower passivation layer 703 may be disposed on a lower surface of the substrate 701, and the lower pads 705 may be on the lower passivation layer 703. The lower pads may be connected to the through-electrodes 730. The chip structure 1000 and the processor chip 800 may be electrically connected to the package substrate 600 through the bumps 720 disposed on the lower pads 705.

The interconnection layer 710 may be disposed on an upper surface of the substrate 701, and may include an interlayer insulating layer 711 and a single-layer or multi-layer interconnection structure 712. When the interconnection layer 710 has a multilayer interconnection structure, interconnections of different layers may be connected to each other through vertical contacts.

The through-electrode 730 may extend from the upper surface to the lower surface of the substrate 701 to penetrate through the substrate 701. In addition, the through-electrode 730 may extend inwardly of the interconnection layer 710 to be electrically connected to interconnections of the interconnection layer 710. When the substrate 701 is silicon, the through electrode 730 may be referred to as a TSV. Other structures and materials of the through-electrode 730 are the same as those described for the semiconductor package 1000A of FIG. 1A. According to example embodiments, the interposer substrate 700 may include only an interconnection layer therein, or may not include a through-electrode.

The interposer substrate 700 may be used to convert or transmit an input electrical signal between the package substrate 600 and the chip structure 1000 or the processor chip 800. Accordingly, the interposer substrate 700 may not include devices, e.g., active devices or passive devices. According to example embodiments, the interconnection layer 710 may also be disposed below the through-electrode 730. For example, a positional relationship between the interconnection layer 710 and the through electrode 730 may be relative.

The bumps 720 may be disposed on a lower surface of the interposer substrate 700 and may be electrically connected to an interconnection of the interconnection layer 710. The interposer substrate 700 may be stacked on the package substrate 600 through the bumps 720. The bumps 720 may be connected to the lower pads 705 through the interconnections of the interconnection layer 710 and the through-electrodes 730. In an example, some pads 705 used for power or ground, among the lower pads 705, may be integrated and connected to the bumps 720, so that the number of the lower pads 705 may be greater than the number of the bumps 720.

The logic chip or the processor chip 800 may include, e.g., a central processor (CPU), a graphics processor (GPU), a field programmable gate array (FPGA), a digital signal processor (DSP), a cryptographic processor, a microprocessor, a microcontroller, an analog-to-digital converter, an application-specific IC (ASIC), or the like. According to the types of devices included in the logic chip 800, the semiconductor package 10000 may be classified into a server-oriented semiconductor package or a mobile-oriented semiconductor package.

The chip structure 1000 may have characteristics that are the same as or similar to those of the semiconductor packages 1000A, 1000Aa, 1000Ab, and 1000B illustrated in FIG. 1A to 4B. For example, the chip structure 1000 may include the dam structures 500 disposed on the base chip 100, and the adhesive films 300A, 300B1, 300B2, and 300C may be formed to have specific shapes based on the dam structures 500.

The semiconductor package 10000A according to an example embodiment may further include an inner encapsulant covering a side surface and an upper surface of the chip structure 1000 and the processor chip 800 on the interposer substrate 700. The semiconductor package 10000A may further include an external encapsulant covering the interposer substrate 700 and the internal encapsulant on the package substrate 600. According to example embodiments, the external encapsulant and the internal encapsulant may be formed together and may not be distinguished from each other. According to example embodiments, the internal encapsulant may cover only the upper surface of the processor chip 800 and may not cover the upper surface of the chip structure 1000.

Figure 6:
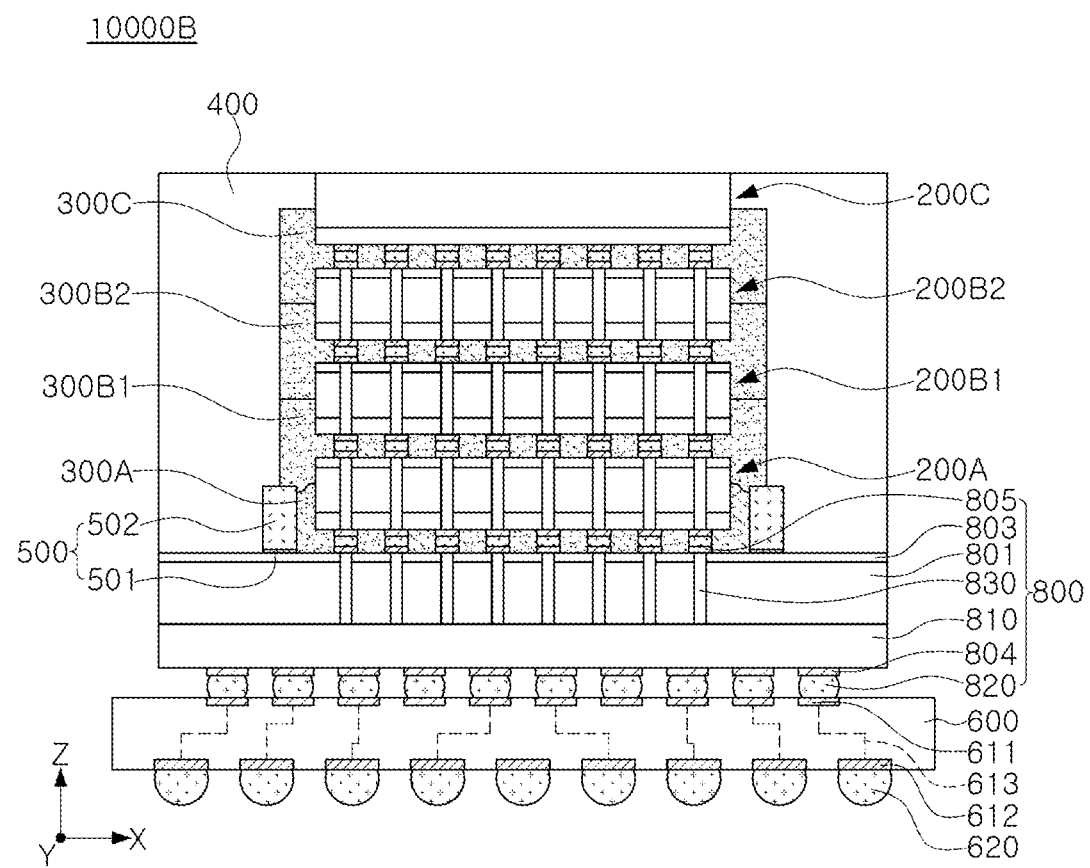
FIG. 6 is a cross-sectional view of a semiconductor package according to an example embodiment.

FIG. 6 is a cross-sectional view of a semiconductor package according to an example embodiment.

Referring to FIG. 6, a semiconductor package 10000B according to an example embodiment may be understood to have features that are the same as or similar to those of the semiconductor packages illustrated in FIGS. 1A to 4B, except that a logic chip (i.e., a logic chip 800) and the plurality of semiconductor chips 200A, 200B1, 200B2, and 200C are sequentially stacked on the base chip 100. Therefore, descriptions overlapping with those described with reference to FIGS. 1A to 4B will be omitted.

The plurality of semiconductor chips 200A, 200B1, 200B2, and 200C may include a memory chip, may be stacked on the logic chip 800 in a vertical direction (the Z-axis direction), and may be electrically connected to the package substrate 600 through a through-electrode 830 in the logic chip 800. According to example embodiments, the plurality of semiconductor chips 200A, 200B1, 200B2, and 200C may be disposed side by side in a horizontal direction (the X-axis and Y-axis directions) on an upper surface of the logic chip 800.

The logic chip 800 may include elements similar to the base chip 100 illustrated in FIG. 1A, or the like. For example, the logic chip 800 may include a substrate 801, a device layer 810, an external connection terminal 820, the through-electrode 830, and the like. As described with reference to FIGS. 5A and 5B, the logic chip 800 may include a processor chip, e.g., a CPU or a GPU.

FIGS. 7A to 7I are cross-sectional views of stages in a method of manufacturing a semiconductor package according to an example embodiment.

Figure 7A:
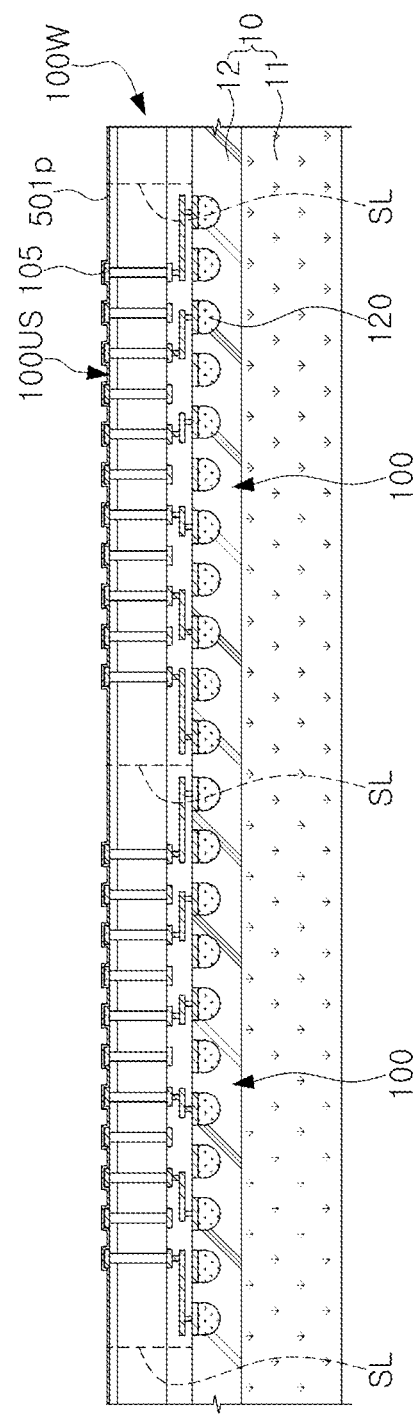
FIGS. 7A to 7I are cross-sectional views of stages in a method of manufacturing a semiconductor package according to an example embodiment.

Referring to FIG. 7A, a preliminary seed layer 501p may be formed on the base chip 100. The base chip 100 may be a semiconductor wafer 100W including a plurality of base chips 100 divided by scribe lanes SL.

In detail, the semiconductor wafer 100W may be disposed on a carrier 10. The carrier 10 may include a support substrate 11 and an adhesive material layer 12. The semiconductor wafer 100W may be attached to the carrier 10 such that a lower surface of the base chip 100, on which the external connection terminal 120 is disposed, is directed toward the adhesive material layer 12. The external connection terminal 120 may be covered with the adhesive material layer 12, and a lower surface of the semiconductor wafer 100W may be in contact with an upper surface of the adhesive material layer 12.

The preliminary seed layer 501p may be conformally formed along the upper surface 100US of the base chip 100 using a deposition process, e.g., a CVD or PVD process. The preliminary seed layer 501p may include, e.g., titanium (Ti), copper (Cu), or the like, and may have etching selectivity with respect to the upper pad 105.

Figure 7B:
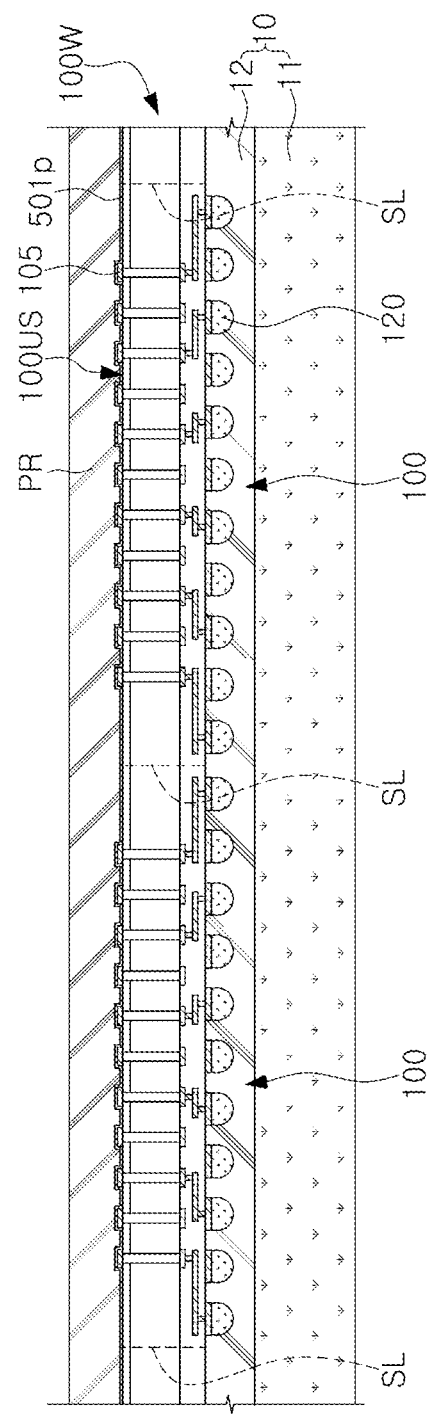

Referring to FIG. 7B, a photosensitive material layer PR may be formed on the preliminary seed layer 501p. The photosensitive material layer PR may be a positive or negative type photoresist. The photosensitive material layer PR may be formed to have a thickness sufficient to secure heights of the dam structures 500 described with reference to FIGS. 1A to 1C. The photosensitive material layer PR may be formed by coating a photosensitive ink on the semiconductor wafer 100W.

Figure 7C:
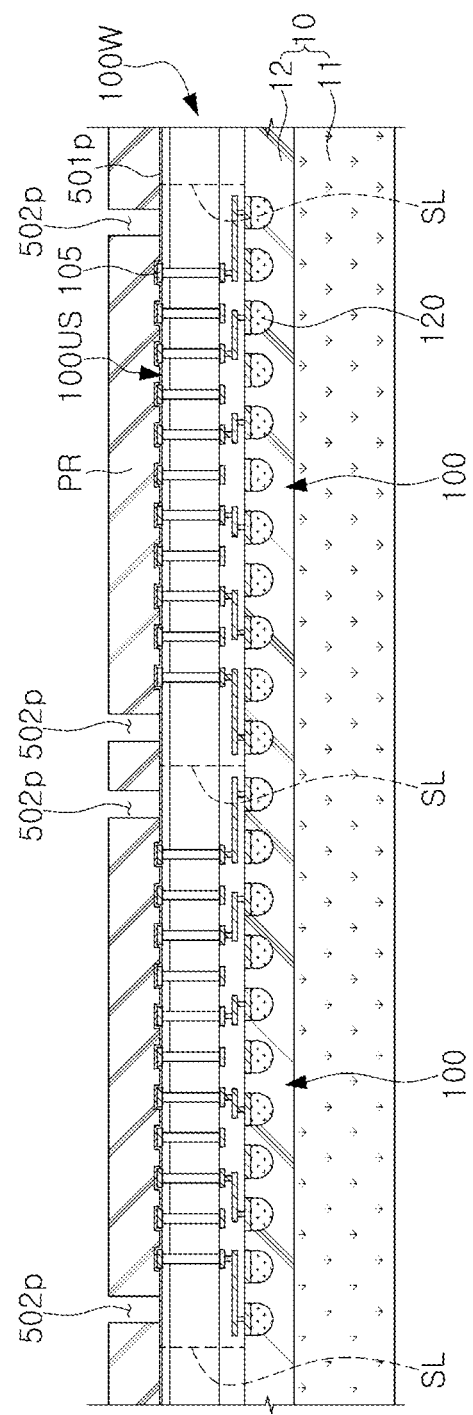

Referring to FIG. 7C, the photosensitive material layer PR may be patterned such that trenches 502p are formed to expose the preliminary seed layer 501p. The photosensitive material layer PR may be patterned using a photolithography process. The photolithography process may include a series of processes, e.g., an exposure process using a photomask, a developing process, a cleaning process, and the like. The trenches 502p may be formed to surround the upper pads 105 of the semiconductor wafer 100W. For example, referring to FIG. 7C, a single trench 502p may surround all the upper pads 105 of one base chip 100, as viewed in a top view (e.g., two trenches 502p in a cross-sectional view correspond to a ring-shaped structure). Also, the trenches 502p may be formed to be spaced apart from an outermost upper pad 105 by a predetermined distance.

Figure 7D:
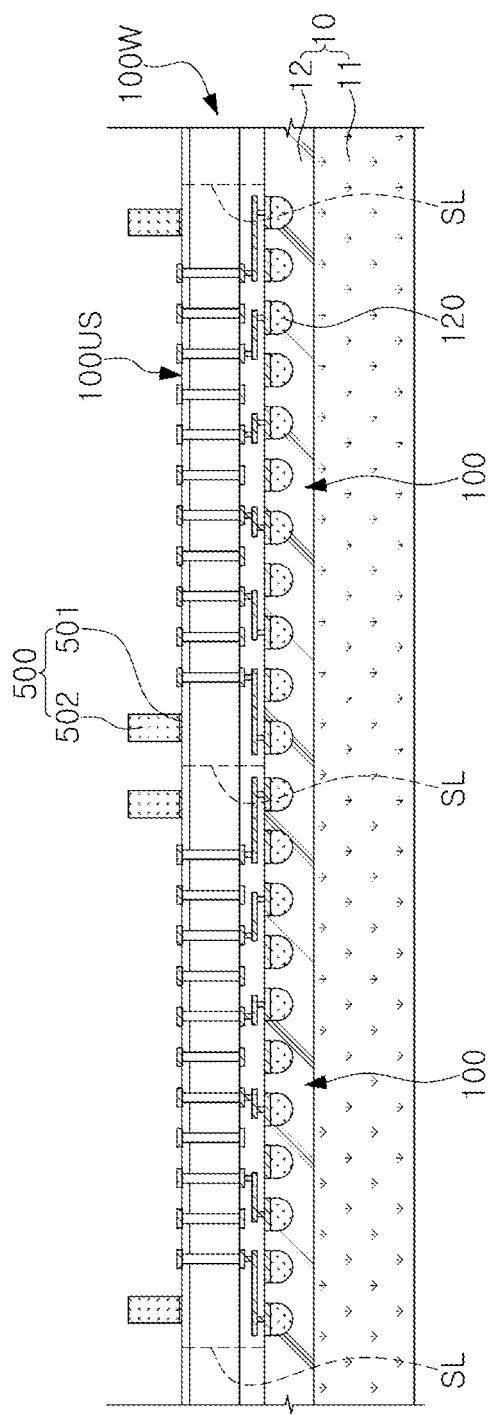

Referring to FIG. 7D, the dam structures 500 including the seed layer 501 and the metal layer 502 may be formed.

The metal layer 502 may be formed by performing an electroplating process using the preliminary seed layer 501p of FIG. 7C, and may be formed of a metal, e.g., copper (Cu) or a copper (Cu) alloy. The seed layer 501 may be formed by forming the metal layer 502, removing the photosensitive material layer PR of FIG. 7C, and etching the preliminary seed layer 501p of FIG. 7C exposed from the metal layer 502.

Figure 7E:
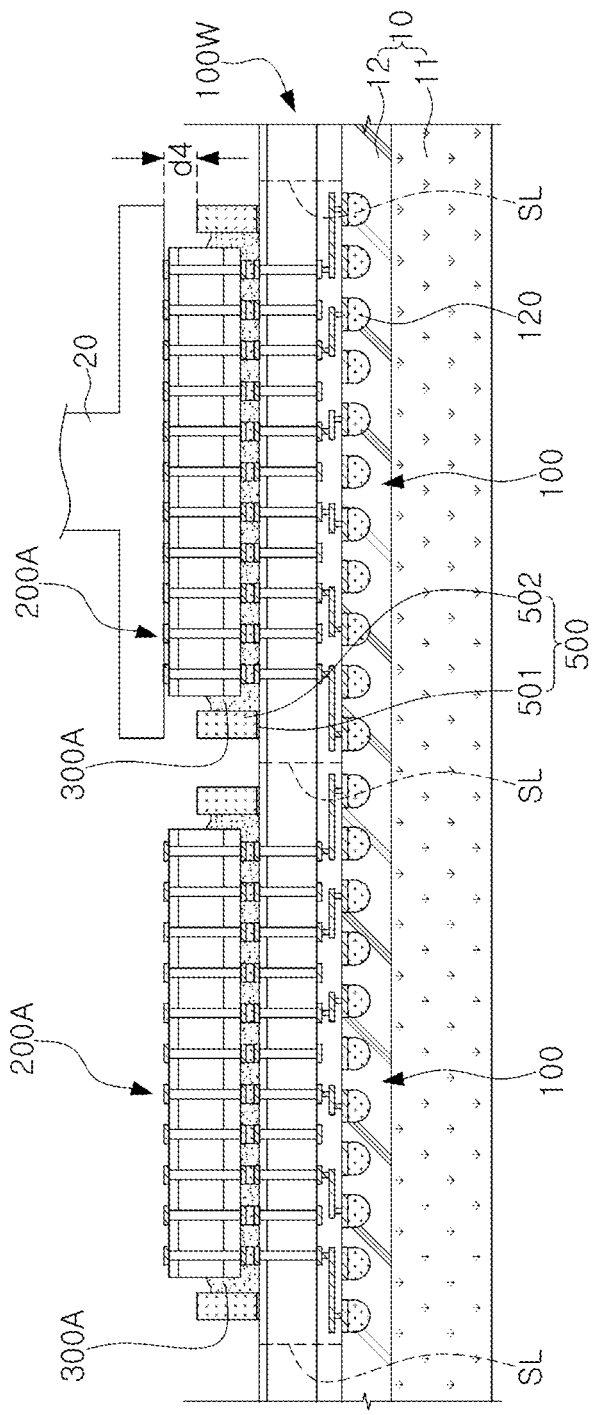

Referring to FIG. 7E, the first semiconductor chips 200A may be mounted on the base chip 100 by performing a thermocompression bonding process. The first adhesive film 300A may be disposed below the first semiconductor chip 200A. The first semiconductor chip 200A may be vacuum-adsorbed to a bonding head 20 to be picked and placed on the semiconductor wafer 100W. The dam structures 500 may have a predetermined separation distance d4 from a lower surface of the bonding head 20. If the dam structures 500 were to be in contact with the lower surface of the bonding head 20, sufficient pressure could not have been transferred in the thermocompression bonding process of the first semiconductor chip 200A, and adhesive force of the first semiconductor chip 200A would have been reduced.

Figure 7F:
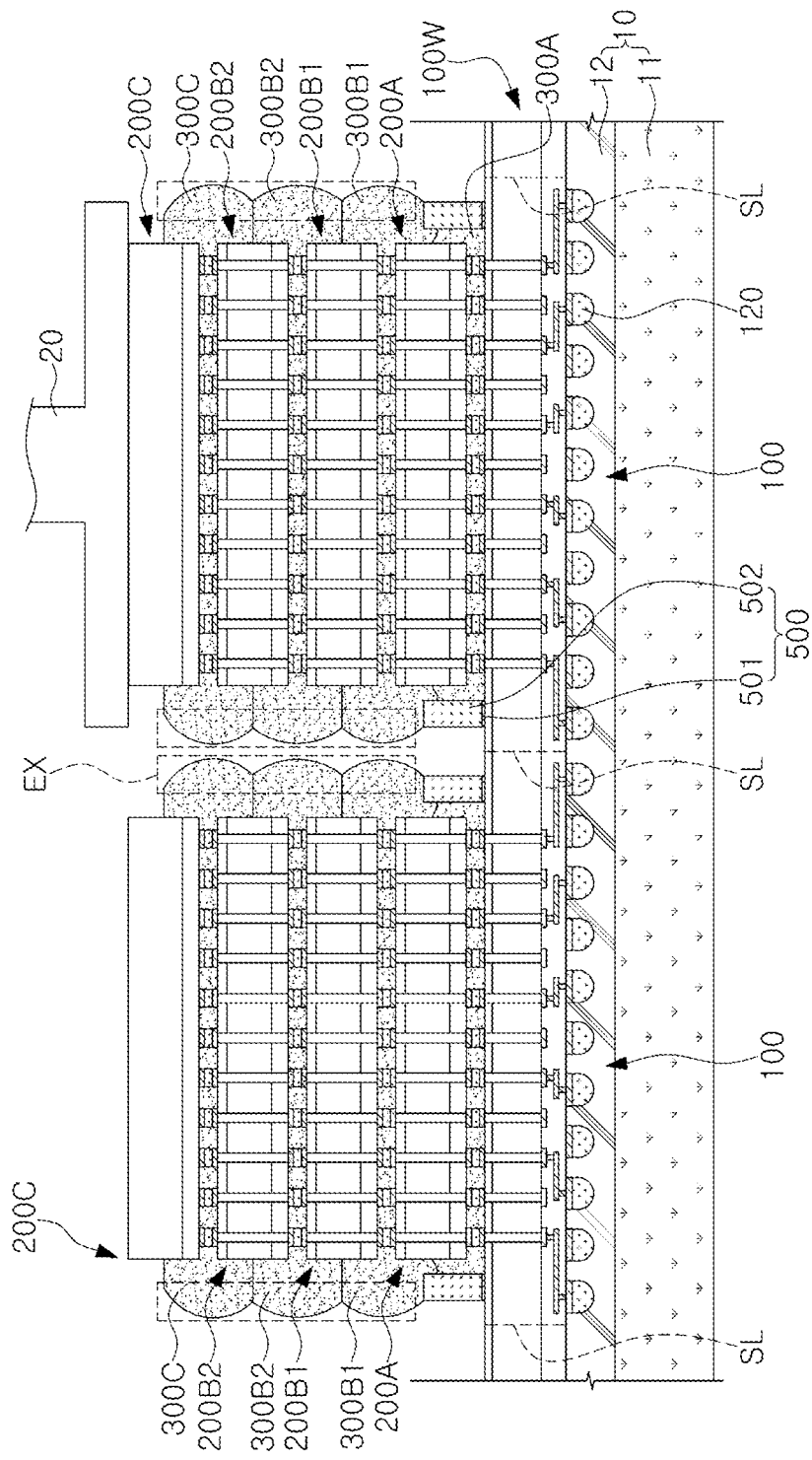

Referring to FIG. 7F, the plurality of second semiconductor chips 200B1, 200B2, and 200C may be sequentially stacked on the first semiconductor chip 200A by repeatedly performing the thermocompression bonding process. Second adhesive films 300B1, 300B2, and 300C may be disposed below the plurality of second semiconductor chips 200B1, 200B2, and 200C, respectively. The second adhesive films 300B1, 300B2, and 300C may have an extension region EX protruding farther outwardly than the dam structures 500 by a thermocompression bonding process.

Figure 7G:
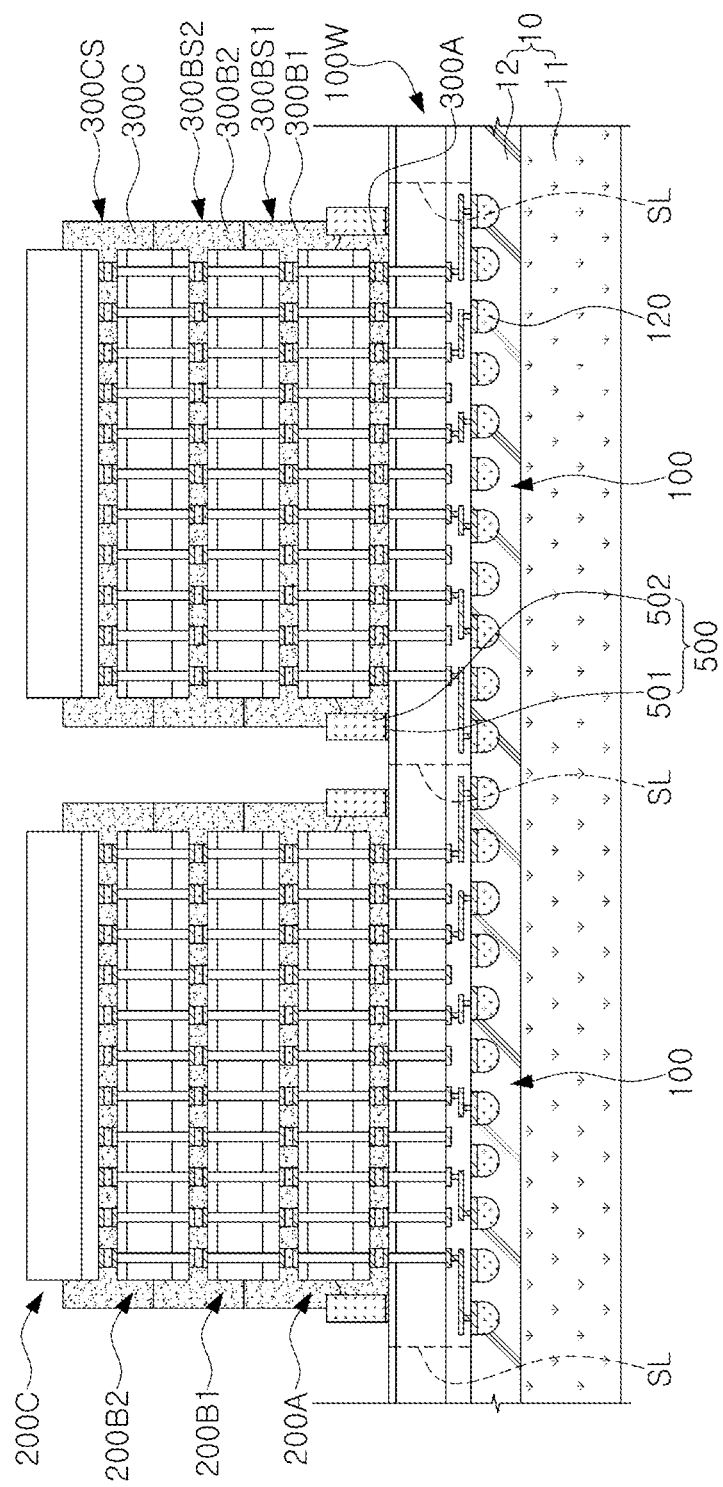

Referring to FIGS. 7F and 7G, the extension region EX of the second adhesive films 300B1, 300B2, and 300C of FIG. 7F may be cut, so that side surfaces 300BS1 and 300BS2 of the second adhesive films 300B1, 300B2, and 300C may be formed to be disposed on upper surfaces of the dam structures 500.

That is, since the extension region EX may cause poor exterior and a decrease in reliability of the semiconductor package, the extension region EX of the second adhesive films 300B1, 300B2, and 300C may be removed, according to example embodiments, without damage to the base chip 100 using the dam structures 500. Due to the cutting process, the side surfaces 300BS1, 300BS2, 300C of the second adhesive films 300B1, 300B2, 300C may be substantially coplanar, and the second adhesive films 300B1, 300B2, and 300C may not protrude further outwardly than the dam structures 500.

Figure 7H:
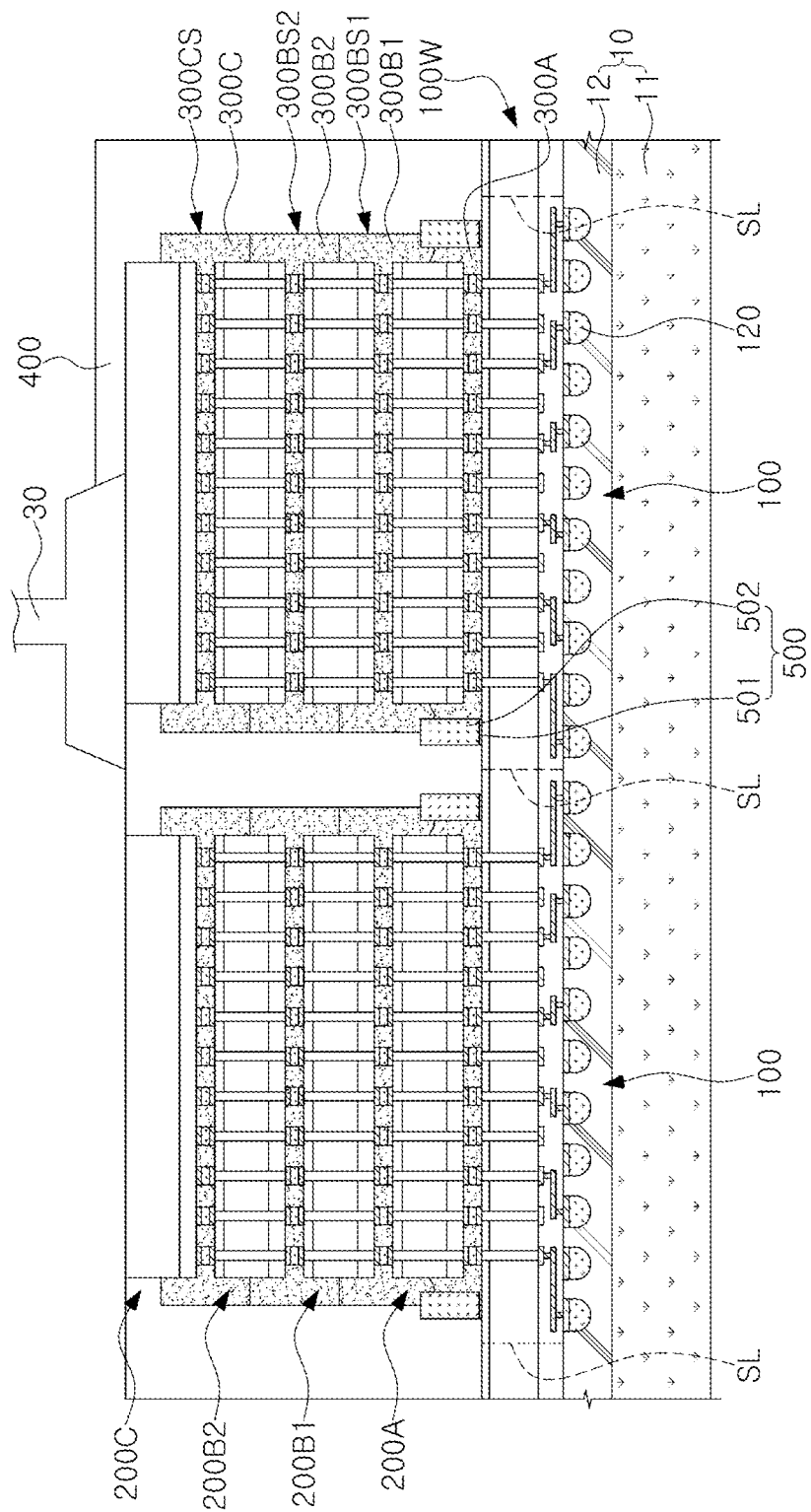

Referring to FIG. 7H, the encapsulant 400 may be formed on the semiconductor wafer 100W, and an upper surface of the encapsulant 400 may be planarized using a polishing apparatus 30. In an example embodiment, the encapsulant 400 may be formed to cover the side surfaces 300BS1, 300BS2, and 300C of the second adhesive films 300B1, 300B2, and 300C and side surfaces and at least a portion of upper surfaces of the dam structures 500. Due to the planarization process, an upper surface of the encapsulant 400 may be disposed to be substantially coplanar with an upper surface of the uppermost second semiconductor chip 200C. The planarization process may be, e.g., a chemical mechanical polishing (CMP) process.

Figure 7I:
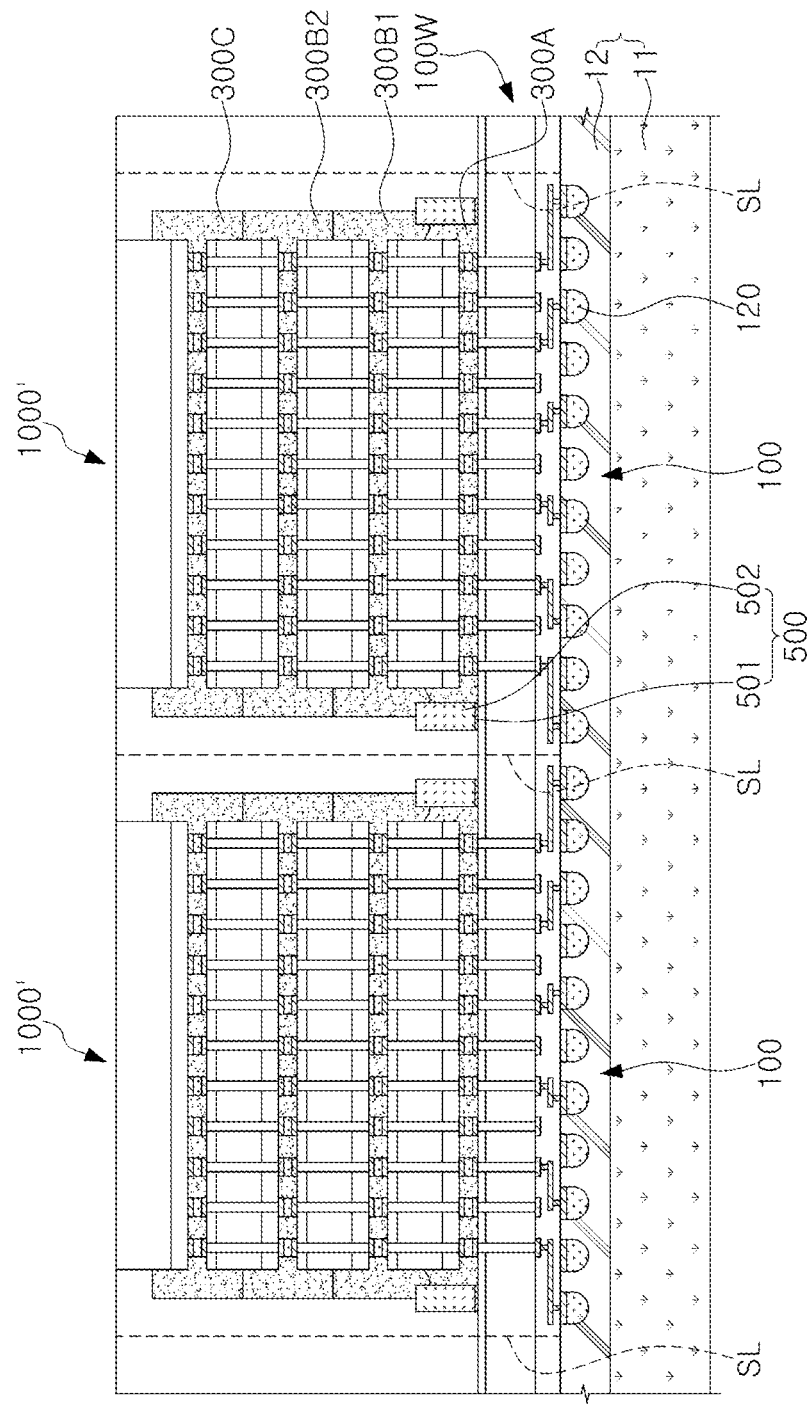

Referring to FIG. 7I, the encapsulant 400 and the semiconductor wafer 100W may be cut along scribe lanes SL to divide a plurality of semiconductor packages 1000'. The plurality of semiconductor packages 1000' may have features that are the same as or similar to those of the semiconductor packages described with reference to FIGS. 1A to 4B. The semiconductor package 1000', completed through the above-described manufacturing process, may have reliability improved by controlling the expansion region of the first and second adhesive films 300A, 300B1, 300B2, and 300C using the dam structures 500.

By way of summation and review, example embodiments provide a semiconductor package having improved reliability. That is, according to example embodiments, a semiconductor package having improved reliability may be provided by introducing a dam structure controlling an extension region of an adhesive film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a base chip;
   a first semiconductor chip on the base chip;
   at least one second semiconductor chip on the first semiconductor chip in a first direction perpendicular to an upper surface of the base chip, each of the first semiconductor chip and the at least one second semiconductor chip including a through-silicon via (TSV), and the first semiconductor chip and the at least one second semiconductor chip being electrically connected to each other via the TSV;
   dam structures on the base chip, the dam structures surrounding a periphery of the first semiconductor chip;
   a first adhesive film between the base chip and the first semiconductor chip, the first adhesive film including a first portion filling a space between the first semiconductor chip and the base chip and a second portion disposed in a space between a side of the first semiconductor chip and each of the dam structures;
   a second adhesive film between the first semiconductor chip and the at least one second semiconductor chip, at least a portion of the second adhesive film overlapping an upper surface of each of the dam structures in the first direction; and
   an encapsulant encapsulating at least a portion of each of the dam structures, the first semiconductor chip, and the at least one second semiconductor chip.

2. The semiconductor package as claimed in claim 1, wherein a maximum width of the first adhesive film in a second direction, perpendicular to the first direction, is less than or equal to a maximum width of the second adhesive film in the second direction.

3. The semiconductor package as claimed in claim 1, wherein:
   the dam structures have inner surfaces facing the first semiconductor chip, outer surfaces opposing the inner surfaces, and upper surfaces connecting the inner surfaces and the outer surfaces to each other; and at least a portion of the upper surfaces and the outer surfaces of the dam structures are in contact with the encapsulant.

4. The semiconductor package as claimed in claim 3, wherein the second portion of the first adhesive film filling the space between the first semiconductor chip and the dam structures is in contact with the inner surfaces of the dam structures.

5. The semiconductor package as claimed in claim 3, wherein side surfaces of the second adhesive film are on the upper surfaces of the dam structures.

6. The semiconductor package as claimed in claim 5, wherein:
the second adhesive film is provided in a plurality of second adhesive films,
the at least one second semiconductor chip includes a plurality of second semiconductor chips stacked on top of each other along the first direction, the plurality of second adhesive films being positioned between adjacent ones of the plurality of second semiconductor chips, respectively, and
side surfaces of the plurality of second adhesive films are coplanar with each other.

7. The semiconductor package as claimed in claim 1, wherein the upper surface of each of the dam structures is positioned between an upper surface of the first semiconductor chip and a lower surface of the first semiconductor chip, and
wherein the upper surface of each of the dam structures is lower than the upper surface of the first semiconductor chip.

8. The semiconductor package as claimed in claim 1, wherein the dam structures have a height of about 90% or less and about 60% or more of a height from the upper surface of the base chip to an upper surface of the first semiconductor chip.

9. The semiconductor package as claimed in claim 1, wherein the dam structures extend along corresponding side surfaces of the first semiconductor chip, the dam structures being respectively spaced apart from the corresponding side surfaces of the first semiconductor chip.

10. The semiconductor package as claimed in claim 9, wherein the dam structures have a predetermined separation distance from side surfaces of the base chip.

11. The semiconductor package as claimed in claim 10, wherein the predetermined separation distance is about 10 micrometers or more.

12. The semiconductor package as claimed in claim 1, wherein, in a plan view, the dam structures respectively correspond to side surfaces of the first semiconductor chip and have a shape extending continuously or discontinuously between the side surfaces of the first semiconductor chip and side surfaces of the base chip.

13. The semiconductor package as claimed in claim 12, wherein the dam structures have a length of about 90% or less of a length of the side surfaces of the base chip.

14. The semiconductor package as claimed in claim 12, wherein the dam structures are spaced apart from each other in a corner portion of the base chip, a space between the dam structures being filled with the encapsulant.

15. The semiconductor package as claimed in claim 1, wherein the dam structures include a seed layer on the upper surface of the base chip, and a metal layer on the seed layer.

16. A semiconductor package, comprising:
a base chip;
a semiconductor chip on the base chip;
dam structures on the base chip and surrounding a side surface of the semiconductor chip, an upper surface of each of the dam structures being at a level lower than a level of an upper surface of the semiconductor chip; and
an adhesive film having a first portion between the base chip and the semiconductor chip and a second portion protruding beyond the side surface of the semiconductor chip to be in contact with an inner surface of the dam structures,
wherein an upper surface of the second portion contacts the side surface of the semiconductor chip,
wherein the second portion of the adhesive film is disposed in a space between a side of first semiconductor chip and each of the dam structures, and
wherein the upper surface of each of the dam structures is positioned between the upper surface of the semiconductor chip and a lower surface of the semiconductor chip.

17. The semiconductor package as claimed in claim 16, wherein the adhesive film is not in contact with the upper surface of the dam structures.

18. A semiconductor package, comprising:
a base chip;
a first semiconductor chip and second semiconductor chips sequentially stacked on the base chip;
dam structures on the base chip, the dam structures respectively corresponding to side surfaces of the first semiconductor chip;
a first adhesive film including a first portion disposed between the base chip and the first semiconductor chip and a second portion disposed in a space between a side of the first semiconductor chip and each of the dam structures; and
second adhesive films between the first semiconductor chip and a lowermost second semiconductor chip of the second semiconductor chips, and between adjacent ones of the second semiconductor chips,
wherein the first adhesive film or a lowermost second adhesive film of the second adhesive films is in contact with an upper surface of each of the dam structures,
wherein an uppermost second adhesive film of the second adhesive films is disposed between an uppermost second semiconductor chip of the second semiconductor chips and another second semiconductor chip immediately below the uppermost second semiconductor chip, and
wherein the uppermost second adhesive film has a portion protruding beyond a side surface of the uppermost second semiconductor chip and overlapping the upper surface of each of the dam structures.

19. The semiconductor package as claimed in claim 18, wherein each of the dam structures includes a plurality of dam units arranged side by side with the side surfaces of the first semiconductor chip.

20. The semiconductor package as claimed in claim 19, wherein a distance between adjacent ones of the plurality of dam units is about 5 micrometers or less.

* * * * *